US010936762B2

(12) United States Patent
Landes

(10) Patent No.: US 10,936,762 B2
(45) Date of Patent: Mar. 2, 2021

(54) STRUCTURAL REPRESENTATION AND FACILITATION OF MANIPULATION THEREOF VIA IMPLICIT VERTEX RELATIONSHIPS

(71) Applicant: HERE Global B.V., Eindhoven (NL)

(72) Inventor: Paul Landes, Oak Park, IL (US)

(73) Assignee: HERE Global B.V., Eindhoven (NL)

( * ) Notice: Subject to any disclaimer, the term of this patent is extended or adjusted under 35 U.S.C. 154(b) by 405 days.

(21) Appl. No.: 15/927,650

(22) Filed: Mar. 21, 2018

(65) Prior Publication Data
US 2018/0210974 A1 Jul. 26, 2018

Related U.S. Application Data

(63) Continuation of application No. 14/976,141, filed on Dec. 21, 2015, now Pat. No. 9,959,373, which is a continuation of application No. 13/523,460, filed on Jun. 14, 2012, now Pat. No. 9,245,065.

(51) Int. Cl.
G06F 30/13 (2020.01)
E04B 1/343 (2006.01)
E04B 2/82 (2006.01)
B23P 21/00 (2006.01)

(52) U.S. Cl.
CPC ............ *G06F 30/13* (2020.01); *B23P 21/00* (2013.01); *E04B 1/343* (2013.01); *E04B 2/82* (2013.01)

(58) Field of Classification Search
CPC ..... A61C 99/0081; B23P 21/00; E04B 1/343; E04B 2/82; G01C 15/00; G06F 30/00; G06F 30/13; G06K 7/0008; G06K 9/6212; G06Q 10/063; G06Q 10/10; G06T 17/20; G06T 17/30; G08B 21/22; A62C 99/0081
See application file for complete search history.

(56) References Cited

U.S. PATENT DOCUMENTS 3,656,266 A 4/1972 Tylius
3,994,060 A 11/1976 van der Lely et al.
RE33,220 E 5/1990 Collier
5,205,091 A 4/1993 Brown
(Continued)

OTHER PUBLICATIONS

Li et al., "Design With Space Syntax Analysis Based on Building Information Model", Joining Languages, Cultures and Visions: CAADFutures 2009.*
(Continued)

Primary Examiner — Kandasamy Thangavelu
(74) Attorney, Agent, or Firm — Lempia Summerfield Katz LLC

(57) ABSTRACT

The disclosed embodiments relate to a representation of a structure/space as a collection of interrelated partitions whereby manipulation of the partitions causes an automated propagation of the manipulation through the other interrelated partitions as a function of the relationships therebetween. Each partition is defined by one or more vertices, the location(s) of which is/are specified either relative to an origin or relative to, i.e. as a function of, or dependent upon, the location of another vertex within the partition (intra-partition) or within another partition (inter-partition). Where the location of a vertex is moved, the change is propagated implicitly to all other vertices whose location is related, i.e. specified as a function of the modified vertex.

21 Claims, 4 Drawing Sheets

(56) References Cited

U.S. PATENT DOCUMENTS

| | | | |
|---|---|---|---|
| 6,130,673 A * | 10/2000 | Pulli | G06T 17/30 |
| | | | 345/423 |
| 6,151,851 A | 11/2000 | Carter | |
| 6,701,288 B1 | 3/2004 | Normann et al. | |
| 7,246,044 B2 | 7/2007 | Imamura et al. | |
| 8,041,744 B2 | 10/2011 | Heikkonen et al. | |
| 8,532,962 B2 * | 9/2013 | Zhang | G06F 30/13 |
| | | | 703/1 |
| 9,245,065 B2 * | 1/2016 | Landes | E04B 1/343 |
| 9,959,373 B2 * | 5/2018 | Landes | B23P 21/00 |
| 2004/0090437 A1 | 5/2004 | Uesaki et al. | |
| 2004/0122628 A1 * | 6/2004 | Laurie | G01C 15/00 |
| | | | 703/1 |
| 2005/0190053 A1 * | 9/2005 | Dione | G08B 21/22 |
| | | | 340/500 |
| 2005/0209831 A1 | 9/2005 | Jungreis et al. | |
| 2006/0290695 A1 * | 12/2006 | Salomie | G06T 17/20 |
| | | | 345/420 |
| 2007/0112461 A1 * | 5/2007 | Zini | G06K 7/0008 |
| | | | 700/245 |
| 2007/0247458 A1 * | 10/2007 | Surazhsky | G06T 17/20 |
| | | | 345/423 |
| 2009/0160856 A1 * | 6/2009 | Hoguet | G06Q 10/10 |
| | | | 345/420 |
| 2009/0188188 A1 * | 7/2009 | Rivet | A62C 99/0081 |
| | | | 52/270 |
| 2009/0216438 A1 | 8/2009 | Shafer | |
| 2010/0138272 A1 | 6/2010 | Rackham | |
| 2010/0179788 A1 | 7/2010 | Santina et al. | |
| 2011/0197521 A1 | 8/2011 | Courtney | |
| 2011/0218777 A1 * | 9/2011 | Chen | G06F 30/00 |
| | | | 703/1 |
| 2012/0014288 A1 | 1/2012 | Dore et al. | |
| 2012/0053906 A1 | 3/2012 | Sherman et al. | |
| 2012/0055414 A1 | 3/2012 | Correa | |
| 2012/0166140 A1 * | 6/2012 | Weber | G06K 9/6212 |
| | | | 702/180 |
| 2013/0144546 A1 * | 6/2013 | Brackney | G06Q 10/063 |
| | | | 702/61 |
| 2013/0246108 A1 | 9/2013 | Nagy et al. | |

OTHER PUBLICATIONS

Battat, A Fine-Grained Geospatial Representation and Framework for Large-Scale Indoor Environments, Feb. 2010, Massachusetts Institute of Technology.

Choi et al., Real-Time Mangement of Spatial Infomration of Design: A Space-Based Floor Plan Representation of Buildings, 2007, pp. 449-459, Automation in Construction 16.

Dzambazova et al., Understanding BIM, book, chapter 1, Introducing Revit Architecture 2010: BIM for Beginners, Jul. 20, 2009, pp. 1-22.

Li et al., Design with Space yntax Analysis Based on Building Information Model, Joining Languages, 2009, Cultures and Visions: CAADFutures.

Revit Building Information Modeling, Parametric Building Modeling: BIMS Foundation, 2007, pp. 1-6.

Revit MEP 2009 User's Guide, Apr. 2008, Autodeck, Inc.

Weber et al., a.SCAtch—A Sketch-Based Retrieval for Architecture Floor Plans, Nov. 16-18, 2010, 12th International Conference on Frontiers in Handwriting Recognition.

* cited by examiner

STRUCTURAL REPRESENTATION AND FACILITATION OF MANIPULATION THEREOF VIA IMPLICIT VERTEX RELATIONSHIPS

REFERENCE TO RELATED APPLICATIONS

This application is a continuation under 37 C.F.R. § 1.53(b) of U.S. Pat. application Ser. No. 14/976,141 filed Dec. 21, 2015 now U.S. Pat. No. 9,959,373, which is a continuation under 37 C.F.R. § 1.53(b) of U.S. patent application Ser. No. 13/523,460 filed Jun. 14, 2012 now U.S. Pat. No. 9,245,065, the entire disclosures of which are hereby incorporated by reference.

BACKGROUND

A floor plan of a building, or other structure or space, is a representation or model thereof typically depicted as a view from above which may be embodied on paper or in electronic form, such as an electronic image or drawing. A floor plan defines and represents the boundary of the structure/space, referred to as the footprint, for example, as a polygon. A floor plan may further define and represent internal partitioning and/or compartmentalization of the interior, i.e. within the boundary/footprint, such as by depicting the position of walls, e.g. as lines, and other physical features. The floor plan may further represent dimensions and other absolute or relative characteristics of the structure/ space through explicit notation and/or via proportional representations. Where a structure comprises multiple stories, levels or planes separating vertically defined spaces, e.g. floors, a floor plan for each floor, i.e. at each defined elevation, may be generated to depict the layout, unique or not, thereof and may include depictions of features, such as walls, elevator shafts, staircases, etc. shared between or otherwise common among multiple levels.

An exemplary structure is a shopping mall which may have, within its footprint, multiple partitioned spaces for retail establishments across multiple floors. Another example includes an office building having multiple floors partitioned into office space, common rooms, etc.

Floor plans serve many purposes. During the design of the structure/space, a floor plan may serve as a model or blueprint of the structure/space and used to plan and evaluate the design and facilitate construction thereof. Subsequent to construction, the floor plan may be used for remodeling or altering the design at later time. Further, the floor plan may used to generate maps of the structure/space which may be used to assist occupants/visitors in navigating between locations within, e.g. from an entrance to a particular office, store, bathroom, etc. Floor plans may further facilitate integration of a representation of the structure/space into a larger representation of an area in which structure space exists. For example, a regional geographic map may feature a representation of a shopping mall depicted at the geographic location thereof.

A floor plan may be created via free hand or other manual drawing techniques or using computer aided design ("CAD") tools. In either case, for a given floor plan the designer draws representations of, for example, the exterior walls, interior partitions, elevators, staircases, doors, etc. When creating floor plans for multiple levels of a structure, the designer may define the floor plan of each successive level based on a representation of the floor plan of the prior level. For example, they may trace the footprint and common features from the prior level into the new level before then adding the unique features of that level.

While these techniques are straightforward and may result in highly accurate representations of a structure or space, they also suffer from problems. For example, the copying and/or tracing of features between levels can propagate and/or exaggerate design errors such as offsets between features which should be collinear among levels. Such errors may be introduced due to user error and/or due to imprecision in the representation of features, such as on a display screen, as compared with the actual characteristics of the actual physical features. For example, a representation on a computer display may inaccurately represent that two lines are drawn exactly on top of one another when in fact their positions are offset. This may occur due to the resolution or scale at which the computer generates the displayed representation as compared to dimensions of the feature represented thereby. Such errors may only become apparent when the floor plan is suitably manipulated, e.g. scaled or translated, and/or via a visual comparison between levels where, for example, subtle offsets may become visually perceptible. For example, when manipulating, such as scaling or translating, the floor plan of multiple levels for the purpose of creating a derivation thereof, e.g. navigational maps of the interior space, these errors may be revealed as incongruities between the levels and misrepresentations of relationships between locations.

In cartography, rubber-sheeting refers to the process by which a layer, such as a floor plan, may be distorted to allow it to be seamlessly joined to an adjacent geographic layer of matching imagery, such as satellite imagery (most commonly vector cartographic data) which are digital maps. This is sometimes referred to as image-to-vector conflation. Often this has to be done when layers created from adjacent map sheets are joined together. Rubber-sheeting is necessary because the imagery and the vector data will rarely match up correctly due to various reasons, such as the angle at which the image was taken, the curvature of the surface of the earth, minor movements in the imaging platform (such as a satellite or aircraft), and other errors in the imagery. Using floor plans created as described above, this process may reveal misalignments or incongruities or otherwise distort proportions resulting in less accurate or misleading representations.

Another problem with typical floor plan drawing techniques is the difficulty in making modifications or revisions. For example, where a designer wishes to modify a feature whose position may affect other features within a level or across levels, e.g. move an exterior wall, the designer must manually propagate the change to the affected features within the level or otherwise across levels. Propagation of changes is time consuming and affords additional opportunities to introduce errors into the floor plan and/or may reveal or exacerbate errors which were previously made.

DETAILED DESCRIPTION

The disclosed embodiments relate to a representation of a structure or space as a collection of interrelated partitions whereby manipulation of one or more partitions causes an automated propagation of the manipulation through the other interrelated partitions as a function of the relationships therebetween. Each partition is defined by one or more vertices, the location(s) of which is/are specified either relative to an origin or relative to, i.e. as a function of, or dependent upon, the location of another vertex within the partition (intra-partition) or within another partition (inter-partition). Where the location of a vertex is moved, the change is propagated implicitly to all other vertices whose location is related, i.e. specified as a function of the modified vertex. For example, the modification of the location of an exterior wall may cause an automated propagation of that modification among the floor plans representative of the levels having the wall in common as well as among the interior features of the space dependent thereon. Thereby, desired relative positioning of features within a floor plan, as well as between levels, is preserved, e.g. collinearity of walls between levels is assured, absolute or proportioned distances between features is maintained, etc.

The disclosed embodiments may further provide tools to assist a user in ensuring that desired relationships between features of the structure or space are accurately represented. For example, when defining the boundary, i.e. wall, of multiple levels, the disclosed embodiments may recognize when the user intends the boundary of one level to be collinear with the previously defined boundary of another level, such as based on a threshold difference in the specification thereof, and automatically adjust, e.g. "snap", the location of the new boundary to be exactly over the prior boundary.

Figures 4A, 4B:
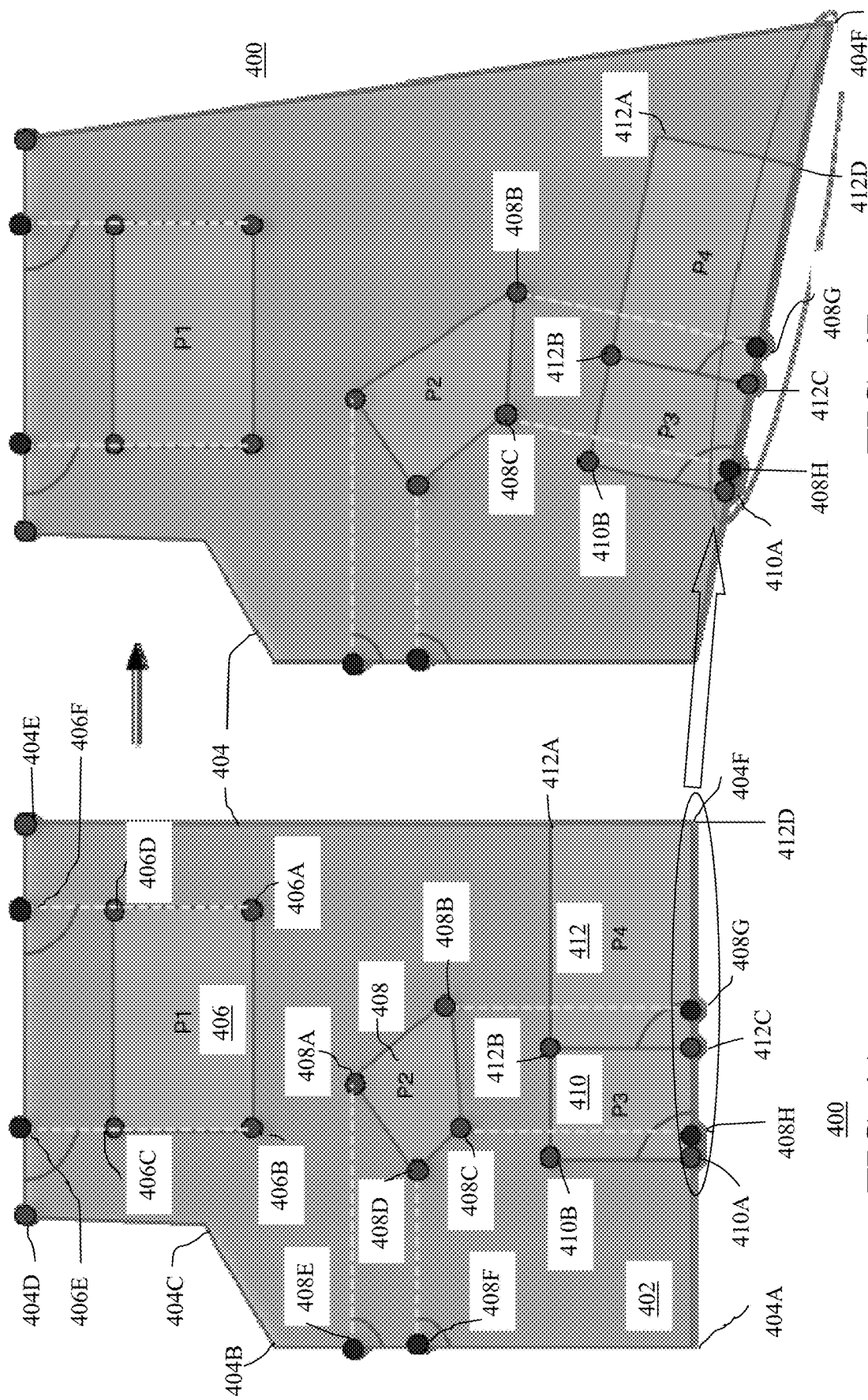
FIGS. 4A and 4B depict representations of an exemplary floor plan diagrams of story of a structure according to the disclosed embodiments.

FIGS. 4A and 4B show an exemplary floor plan diagram 400 of one story of a structure. As used herein, a story is defined as the space in a building between two adjacent floor levels or between a floor and the roof and may include a set of rooms in such a space. The floor plan 400 depicts an area 402 defined by the boundary of the story as well as several partitioned spaces within, designated in the figures as P1 406 (designated by vertices 406A-D and fringe vertices 406E-H), P2 408 (designated by vertices 408A-D and fringe vertices 408E-F), P3 410 (designated by vertices 410A-B and 412B-C), and P4 412 (designated by vertices 412A-D), which may be depicted as polygons. As used herein, the term "polygon" may refer to geometric object consisting of a number of points, which may be referred to as vertices, and an equal number of line segments, which may be referred to as sides or edges, or alternatively as a cyclically ordered set of points in a plane, with no three successive points collinear, together with the line segments joining consecutive pairs of the points, e.g., a polygon may be a closed broken line lying in a plane. It will be appreciated that the line segments which make up the sides/edges need not be straight lines and may include curves, such as a b-spline or other Bezier curve, which may be collectively referred to herein as "lines." The boundary 404 of the story is defined by the locations of vertices 404A-404F. The position of at least one of the vertices 404A-404F may be defined relative to an origin (not shown) whereas the location of the remaining vertices 404A-404F may be defined either relative to the origin and/or relative to each other. The relationship may be an absolute distance between the related vertices, a proportionate distance between the related vertices, defined by an angle relative to a fixed direction, defined by a characteristic of the positions of the vertices, such as a collinearity there between in particular direction, e.g. vertically collinear, or a combination thereof. For example, vertex 404A may be defined as 10 units east and 10 units north of the origin. Vertex 404B may then be defined as 50 units north of vertex 404A or as 10 units east and 60 units north of the origin. The remaining vertices 404C-F may be similarly defined. Defining one vertex in relation to another vertex creates an implicit relationship which, as will be described below, is maintained by the disclosed system 100 when either vertex is modified. A vertex specified relative solely to the origin may be referred to as an absolute or anchor vertex whereas a vertex specified, at least in part, with respect to another vertex may be referred to as a relative vertex. Lines or curves depicted/connected, such as solid or dotted lines, between vertices may represent walls or other structural interconnection spanning the space between the associated vertices or may represent some other relationship there between. The lack of a line/curve depicted/connected between vertices may represent a passage or opening there between or the lack of a relationship between vertices. Other representations may be used to depict windows, doors, stairways elevators, etc. It will be appreciated that manner and arrangement of such depictions are implementation dependent. While vertices which define the boundary 404 of the story generally are locations where the boundary changes direction so as to form a polygon, e.g. locations between non-collinear vertices, vertices may also be specified along the boundary so as to define openings, doorways, windows or other passages or connections, or as will be described, to define locations of interior partitions. As such, relative vertices may be further categorized as "fringe" vertices, defined collineararily between two vertices which form part of the boundary 404 of the story, and "floating" vertices, which are located within space defined by the boundary 404 of the story, and which may be defined relative to an origin and/or another vertex. As will be described, fringe and floating vertices may be utilized to define partitions within the story.

Generally, one example of an implicit function is a function in which the dependent variable has not been given "explicitly" in terms of the independent variable. To give a function f explicitly is to provide a prescription for determining the output value of the function y in terms of the input value x:

$$y=f(x).$$

By contrast, the function is implicit if the value of y may be obtained from x by solving an equation of the form:

$$R(x,y)=0.$$

That is, it is defined as the level set of a function in two variables: one variable may determine the other, but one is not given an explicit formula for one in terms of the other. Implicit functions can often be useful in situations where it is inconvenient to solve explicitly an equation of the form $R(x,y)=0$ for y in terms of x. Even if it is possible to rearrange this equation to obtain y as an explicit function f(x), it may not be desirable to do so since the expression off may be much more complicated than the expression of R. In other situations, the equation $R(x,y)=0$ may fail to define a function at all, and rather defines a kind of multiple-valued function. It will be appreciated that there may be other forms of mathematical or logical implicit functions which may used with the embodiments disclosed herein.

While the disclosed embodiments generally describe implicit relationships between vertices, it will be appreciated that implicit relationships between edges/sides of polygons, i.e. the characterizing parametric information, may also be implemented, whether those edges are straight lines or curves, e.g. b-splines. Accordingly, where such edges are implicitly related, changes to one edge, e.g., a change to the parametric data characteristic thereof, may be propagated to the other related edges so as to maintain the relationship there between as described herein.

As discussed above, interior partitions, such as interior partitions P1, P2, P3, and P4 shown in FIGS. 4A and 4B, which may be represented/depicted as polygons, are similarly defined by vertices, which may be specified in relation to an origin and/or to other vertices, e.g., anchor, relative, fringe, floating or combinations thereof. The boundary of some partitions may be defined, at least in part, by at least a portion of the exterior boundary 404 of the story. For example, partition P4 may be constructed in the corner of the story using two walls extending from the exterior walls of the story. Other partitions may be defined by a boundary entirely within the space, e.g., concentric, defined by the boundary 404 of the story. It will be appreciated that, while not shown, the entire interior area of the story defined by the boundary 404 may be considered a partition. Partitions may include rooms, kiosks or other distinctly defined spaces and may be partially or completely enclosed. As with the vertices 404A-F which define the boundary 404 of the story, the relationships which define the locations of the vertices which define a partition may include an absolute distance between the related vertices, a proportionate distance between the related vertices, defined by an angle relative to a fixed direction, defined by a characteristic of the positions of the vertices, such as a collineararity there between in particular direction, e.g. vertically collinear, or a combination thereof. Vertices which are located within the space defined by the boundary 404 may be defined relative, e.g. 40 feet and 90 degrees, to a fringe vertex defined at a location between two vertices of the boundary 404, or relative to a single vertex of the boundary 404, e.g. by an angle and magnitude such as 30 degrees, 120 feet. It will be appreciated that such locations may be specified using polar coordinates. As with the vertices 404A-F which define the boundary 404 of the story, defining one vertex of the partition in relation to another vertex creates an implicit relationship which, as will be described below, is maintained by the disclosed system 100 when either vertex is modified.

For example, if a first vertex location is specified as being 5 feet and 90 degrees from a second vertex and the second vertex is moved, the location of the first vertex is automatically updated so that it is maintained at 5 feet and 90 degrees form the first vertex. If a first vertex location is specified as being 50% of the distance between second and third vertices and either, or both, the second and third vertices are moved, the location of the first vertex will automatically change to maintain its relationship of 50% of the distance between the second and third vertices.

FIG. 4B demonstrates what happens when vertex 404F is moved. As can be seen, the locations of the vertices defining partitions P2, P3 and P4, which were specified in some manner relative to vertex 404F, have been modified based on the change in location of vertex 404F. It will be appreciated that if other stories of the present structure were defined by vertices specified relative to the vertices 404A-F which define the boundary 404 of the story depicted in FIG. 4, those vertices, vertices defined as being vertically collinear to vertex 404F, would automatically be modified to maintain the vertical collinear relationship. Of course all dependent vertices across stories would also be automatically/implicitly modified.

In particular, in one embodiment, a floor plan design tool may operate as shown in Appendix A below, herein incorporated by reference in its entirety.

In one embodiment, a system 100 is provided which includes an interface 134 operative to receive a specification of a structure having at least one story, the specification comprising a set of partition definitions for each story, each partition definition of the set defining a subdivision of the area of the associated story, such as the entire area thereof or just a portion thereof, the subdivision being defined by at least a portion of an outer boundary, at least a portion of an interior boundary or a combination thereof, each partition definition being specified as a location of at least one vertex relative to an origin, relative to at least one other vertex or a combination thereof.

The system 100 further includes a processor 108 coupled with the interface 134 and operative to relate the received partition definition to each previously received partition definition for which a location of at least one vertex of the received partition is specified relative to at least one vertex of the previously received partition definition, and whereby, upon receipt of a modification of at least a portion of at least one partition definition which modifies a location of at least one vertex specified thereby, each other partition definition, related to the partition definition for which the modification was received, is modified as a function of the relationship between the vertex whose location was modified and the vertex of the related partition definition.

Figure 1:
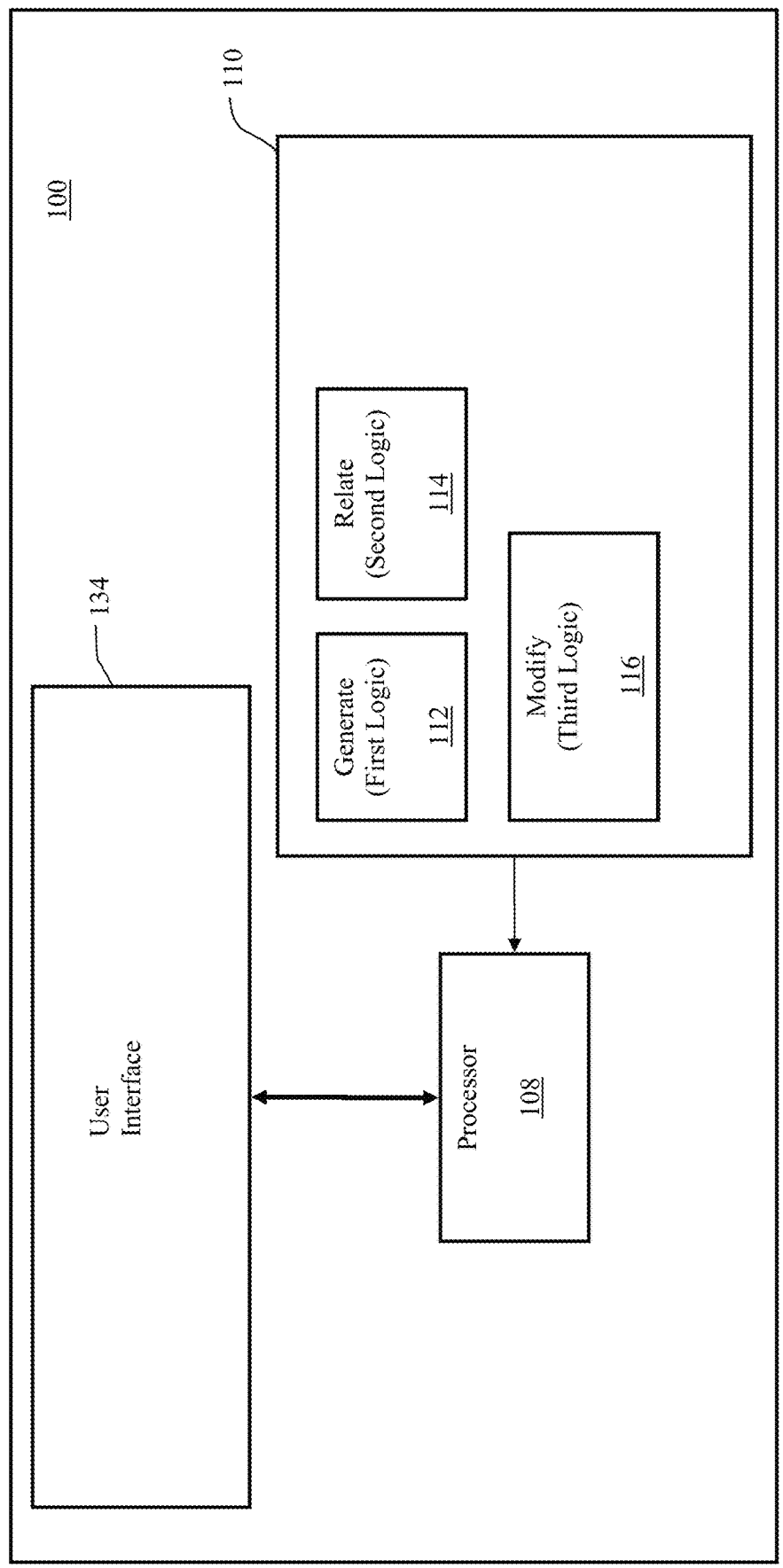
FIG. 1 is a block diagram of an exemplary implementation of the system for facilitating manipulation of a representation of a structure according to the disclosed embodiments.

In particular, FIG. 1 shows a system 100 which generally includes a processor 108 and a memory 110 coupled therewith which may be implemented by one or more of the processor 302 and memory 304 as described below with respect to FIG. 3. In particular, the system 100 may be implemented, at least in part, in a desktop computer, portable computer, mobile device, such as a cellular telephone, smart phone, mobile navigation device or tablet computing device. Further, one or more parts of the system 100 may be implemented in a server, e.g. remote from the desktop/portable computer or mobile device, coupled therewith via a network, such as a wired or wireless network, or combination thereof, e.g. the network 320 described below with respect to FIG. 3.

Herein, the phrase "coupled with" is defined to mean directly connected to or indirectly connected through one or more intermediate components. Such intermediate components may include both hardware and software based components. Further, to clarify the use in the pending claims and to hereby provide notice to the public, the phrases "at least one of <A>, <B>, . . . and <N>" or "at least one of <A>, <B>, <N>, or combinations thereof" are defined by the Applicant in the broadest sense, superseding any other implied definitions herebefore or hereinafter unless expressly asserted by the Applicant to the contrary, to mean one or more elements selected from the group comprising A, B, . . . and N, that is to say, any combination of one or more of the elements A, B, or N including any one element alone or in combination with one or more of the other elements which may also include, in combination, additional elements not listed.

The system 100 further includes an interface 134, e.g., a user interface, coupled with the processor 108 and operative to receive, such as from a user, a specification of a structure having at least one story, the specification comprising a set of partition definitions for each story, each partition definition of the set defining a subdivision of the area of the associated story, which may include the entire area or a portion thereof, the subdivision being defined by at least a portion of an outer boundary, at least a portion of an interior boundary or a combination thereof, each partition definition being specified as a location of at least one vertex relative to an origin, relative to at least one other vertex or a combination thereof. In one embodiment, the relationship between vertices may be specified as one of an absolute distance, a proportionate distance, an angle relative to a fixed direction, collinearity, or a combination thereof. In one embodiment, one partition definition may define a subdivision, which is the entire area of the story, a subdivision of the area of a story which at least partially overlaps a subdivision of the area of the story defined by another partition definition, or a combination thereof. Furthermore, the set of partition definitions for a story may include at least one partition definition defining a subdivision, which is not bounded by an outer boundary of the story. In addition, as will be described below, at least one partition definition of the set of partition definitions of a story of the structure may be specified as a location, within the story, of at least one vertex relative to at least one other vertex, the location of which is specified by another partition definition of a set of partition definitions of a different story of the structure.

The system 100 further includes first logic 112 stored in the memory 110 and executable by the processor 108 to cause the processor 108 to generate a representation of each partition definition upon receipt thereof and store the generated representation in the memory 110.

The system 100 also includes second logic 114 stored in the memory 110 and executable by the processor 108 to cause the processor 108 to relate the stored representation of the received partition definition to each previously stored representation generated for a previously received partition definition for which a location of at least one vertex of the received partition is specified relative to at least one vertex of the previously received partition definition.

In one embodiment, the second logic 114 is further executable by the processor 108 to cause the processor 108 to generate and store, when a received partition definition defines a subdivision having at least a portion of a boundary in common with another subdivision defined by a previously received partition definition, a representation of the common portion of the boundary and relate the representation of the common portion of the boundary to the representations of the associated partition definitions.

The system 100 also includes third logic 116 stored in the memory 110 and executable by the processor 108 to cause the processor 108 to, upon receipt, via the interface 134, of a modification of at least a portion of at least one partition definition which modifies a location of at least one vertex specified thereby, modify each other stored representation, related to the representation of the partition definition for which the modification was received, as a function of the relationship between the vertex whose location was modified and the vertex of the partition definition represented by the related representation. In one embodiment, the processor 108 is operative, based on the received modification, to apply an affine transformation, a rubber sheeting transform, or combination thereof, to each applicable vertex.

In one embodiment, the interface 134 is further operative to receive a modification of at least a portion of at least one partition definition which modifies a location of at least one vertex specified thereby, and based thereon modifying the associated stored representation and wherein the third logic is further executable by the processor to cause the processor to identify each other stored representation related to the representation for which the modification was received, and modify each identified other stored representation so as to modify the partition definition represented thereby such that the relationship between the vertex whose location was modified and the vertex of the partition definition represented by each identified other stored representation is maintained, wherein the identification and modification are further repeated by the processor for each of the identified other stored representations.

In one embodiment, at least one partition definition of the set of partition definitions of a story of the structure is specified as a location, within the story, of at least one vertex relative to at least one other vertex, the location of which is specified by another partition definition of a set of partition definitions of a different story of the structure. In particular, wherein the at location of the at least one vertex is specified substantially collinear, such as vertically collinear, to the location of the at least one other vertex, the first logic 112 may be further executable by the processor 108 to cause the processor 108 to adjust one of the location of the at least one vertex, the location of the at least one other vertex or a combination thereof such that the location of the at least one vertex is collinear with the location of the at least one other vertex.

In one implementation of the disclosed system, specification of all vertices, or a subset thereof, may be received prior to the processor 108 executing the first, second and third logic 112, 114, 116. Alternatively, the system 100 may be implemented such that the first, second and third logic, or subsets thereof, are executed by the processor 108 as vertices are defined, such as in real time as the specifications thereof are received and/or modified.

Figure 2:
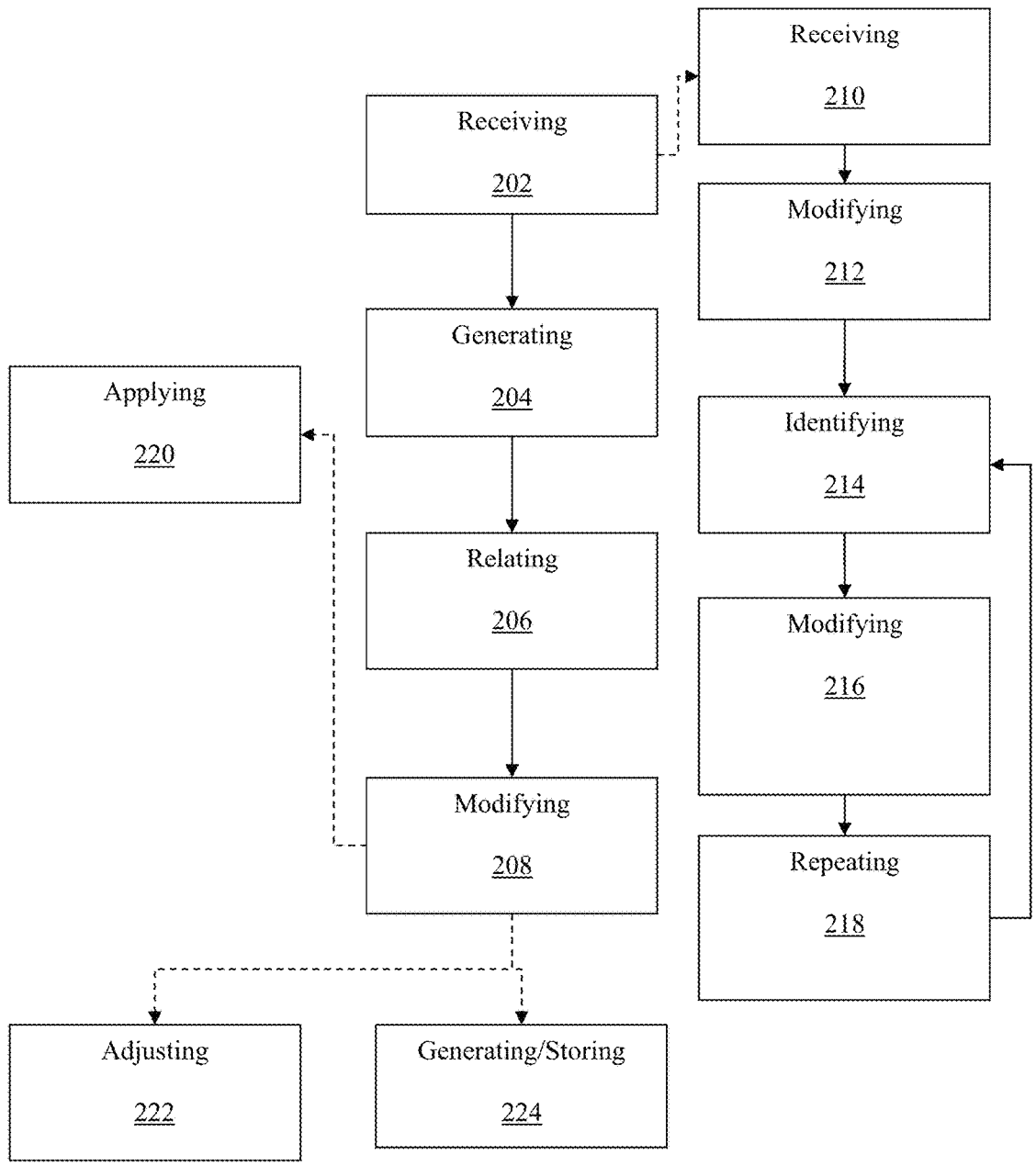
FIG. 2 depicts a flow chart showing operation of the system of FIG. 1.

FIG. 2 depicts a flow chart showing operation of the system 100 of FIG. 1. In particular FIG. 2 shows a computer implemented method which includes receiving, by a processor 108, a specification of a structure having at least one story, the specification comprising a set of partition definitions for each story, each partition definition of the set defining a subdivision of the area of the associated story, the subdivision being defined by at least a portion of an outer boundary of the story of the structure, at least a portion of an interior boundary of the story of the structure or a combination thereof, each partition definition being specified as a location of at least one vertex relative to an origin, relative to at least one other vertex or a combination thereof [Block 202]. The operation of the system 100 further includes generating, by the processor 108, a representation of each partition definition upon receipt thereof and storing the generated representation in a memory 110 coupled with the processor 108 [Block 204] and relating, by the processor 108, the stored representation of the received partition definition to each previously stored representation generated for a previously received partition definition for which a location of at least one vertex of the received partition is specified relative to at least one vertex of the previously received partition definition [Block 206]. Whereby, upon receipt of a modification of at least a portion of at least one partition definition which modifies a location of at least one vertex specified thereby, each other stored representation, related to the representation of the partition definition for which the modification was received, is modified as a function of the relationship between the vertex whose location was modified and the vertex of the partition definition represented by the related representation [Block 208].

In one embodiment, the relationship between vertices may be specified as one of an absolute distance, a proportionate distance, an angle relative to a fixed direction, collinearity, or a combination thereof. In one embodiment, one partition definition may define a subdivision, which is the entire area of the story, a subdivision of the area of a story which at least partially overlaps a subdivision of the area of the story defined by another partition definition, or a combination thereof. Furthermore, the set of partition definitions for a story may include at least one partition definition defining a subdivision, which is not bounded by an outer boundary of the story. In addition, as will be described below, at least one partition definition of the set of partition definitions of a story of the structure may be specified as a location, within the story, of at least one vertex relative to at least one other vertex, the location of which is specified by another partition definition of a set of partition definitions of a different story of the structure.

In one embodiment, the operation of the system 100 may further include: receiving, by the processor 108, a modification of at least a portion of at least one partition definition which modifies a location of at least one vertex specified thereby [Block 210], and based thereon modifying the associated stored representation [Block 212]; identifying, by the processor 108, each other stored representation related to the representation for which the modification was received [Block 214]; and modifying, by the processor 108, each identified other stored representation so as to modify the partition definition represented thereby such that the relationship between the vertex whose location was modified and the vertex of the partition definition represented by each identified other stored representation is maintained [Block 216]; and wherein the identifying and modifying are further repeated by the processor 108 for each of the identified other stored representations [Block 218].

In one embodiment, the modifying further includes applying an affine transformation, a rubber-sheeting transform, or combination thereof, to each vertex [Block 220].

In one embodiment, the operation of the system 100 may further include generating and storing, by the processor when a received partition definition defines a subdivision having at least a portion of a boundary in common with another subdivision defined by a previously received partition definition, a representation of the common portion of the boundary and relating the representation of the common portion of the boundary to the representations of the associated partition definitions [Block 224].

In one embodiment, as was described above, at least one partition definition of the set of partition definitions of a story of the structure is specified as a location, within the story, of at least one vertex relative to at least one other vertex, the location of which is specified by another partition definition of a set of partition definitions of a different story of the structure. Wherein the at location of the at least one vertex is specified substantially collinear to the location of the at least one other vertex, the operation of the system 100 may further include adjusting one of the location of the at least one vertex, the location of the at least one other vertex or a combination thereof such that the location of the at least one vertex is collinear with the location of the at least one other vertex [Block 222].

Figure 3:
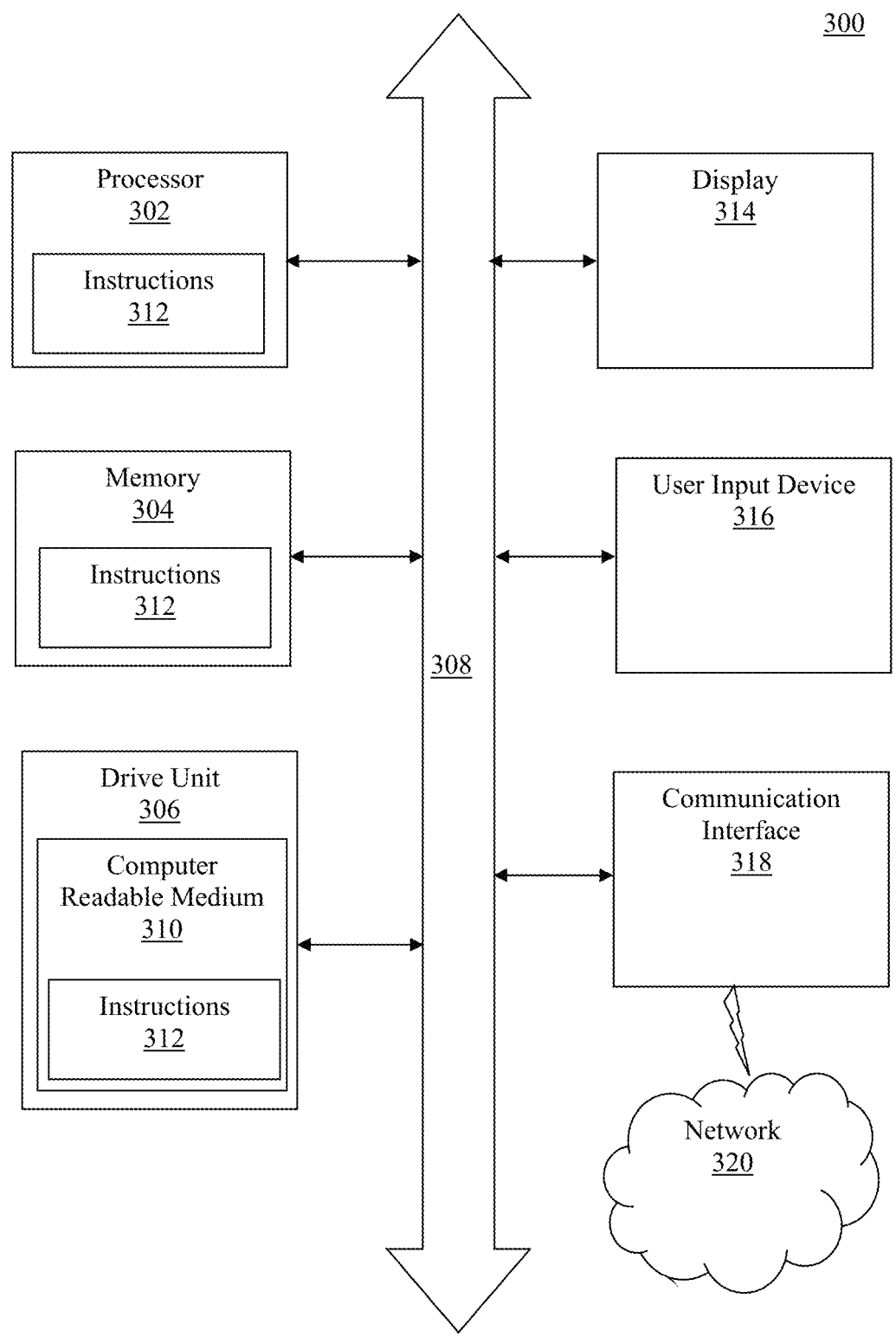
FIG. 3 shows an illustrative embodiment of a general computer system for use with the system of FIG. 1.

Referring to FIG. 3, an illustrative embodiment of a general computer system 300 is shown. The computer system 300 can include a set of instructions that can be executed to cause the computer system 300 to perform any one or more of the methods or computer based functions disclosed herein. The computer system 300 may operate as a standalone device or may be connected, e.g., using a network, to other computer systems or peripheral devices. Any of the components discussed above, such as the processor 108, may be a computer system 300 or a component in the computer system 300. The computer system 300 may implement a navigation system, of which the disclosed embodiments are a component thereof.

In a networked deployment, the computer system 300 may operate in the capacity of a server or as a client user computer in a client-server user network environment, or as a peer computer system in a peer-to-peer (or distributed) network environment. The computer system 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 300 can be implemented using electronic devices that provide voice, video or data communication. Further, while a single computer system 300 is illustrated, the term "system" shall also be taken to include any collection of systems or sub-systems that individually or jointly execute a set, or multiple sets, of instructions to perform one or more computer functions.

As illustrated in FIG. 3, the computer system 300 may include a processor 302, e.g., a central processing unit (CPU), a graphics processing unit (GPU), or both. The processor 302 may be a component in a variety of systems. For example, the processor 302 may be part of a standard personal computer or a workstation. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The computer system 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one embodiment, the memory 304 includes a cache or random access memory for the processor 302. In alternative embodiments, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the programmed processor 302 executing the instructions 312 stored in the memory 304. The functions, acts or tasks are independent of the particular type of instructions set, storage media, processor or processing strategy and may be performed by software, hardware, integrated circuits, firm-ware, microcode and the like, operating alone or in combination. Likewise, processing strategies may include multiprocessing, multitasking, parallel processing and the like.

As shown, the computer system 300 may further include a display unit 314, such as a liquid crystal display (LCD), an organic light emitting diode (OLED), a flat panel display, a solid state display, a cathode ray tube (CRT), a projector, a printer or other now known or later developed display device for outputting determined information. The display 314 may act as an interface for the user to see the functioning of the processor 302, or specifically as an interface with the software stored in the memory 304 or in the drive unit 306. A tactile output may further be provides such a mechanical or piezoelectric vibration motor.

Additionally, the computer system 300 may include an input device 316 configured to allow a user to interact with any of the components of system 300. The input device 316 may be a number pad, a keyboard, or a cursor control device, such as a mouse, or a joystick, touch screen display, remote control, accelerometer, motion sensor, proximity sensor, optional sensor, e.g. a camera, or any other device operative to interact with the system 300.

In a particular embodiment, as depicted in FIG. 3, the computer system 300 may also include a disk or optical drive unit 306. The disk drive unit 306 may include a computer-readable medium 310 in which one or more sets of instructions 312, e.g. software, can be embedded. Further, the instructions 312 may embody one or more of the methods or logic as described herein. In a particular embodiment, the instructions 312 may reside completely, or at least partially, within the memory 304 and/or within the processor 302 during execution by the computer system 300. The memory 304 and the processor 302 also may include computer-readable media as discussed above.

The present disclosure contemplates a computer-readable medium that includes instructions 312 or receives and executes instructions 312 responsive to a propagated signal, so that a device connected to a network 320 can communicate voice, video, audio, images or any other data over the network 320. Further, the instructions 312 may be transmitted or received over the network 320 via a communication interface 318. The communication interface 318 may be a part of the processor 302 or may be a separate component. The communication interface 318 may be created in software or may be a physical connection in hardware. The communication interface 318 is configured to connect with a network 320, external media, the display 314, or any other components in system 300, or combinations thereof. The connection with the network 320 may be a physical connection, such as a wired Ethernet connection or may be established wirelessly as discussed below. Likewise, the additional connections with other components of the system 300 may be physical connections or may be established wirelessly.

The network 320 may include wired networks, wireless networks, or combinations thereof. The wireless network may be a cellular telephone network, an 802.11, 802.16, 802.20, or WiMax network. Further, the network 320 may be a public network, such as the Internet, a private network, such as an intranet, or combinations thereof, and may utilize a variety of networking protocols now available or later developed including, but not limited to TCP/IP based networking protocols.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer readable medium for execution by, or to control the operation of, data processing apparatus. While the computer-readable medium is shown to be a single non-transitory medium, the term "computer-readable medium" includes a single non-transitory medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein. The computer readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having essentially the same functions. Accordingly, replacement standards and protocols having the same or similar functions as those disclosed herein are considered equivalents thereof.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

As used in this application, the term 'circuitry' or 'circuit' refers to all of the following: (a)hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is therefore intended that the foregoing detailed description be regarded as illustrative rather than limiting, and that it be understood that it is the following claims, including all equivalents, that are intended to define the spirit and scope of this invention.

What is claimed is:

1. A method comprising:
   receiving, by a CAD tool, a specification defining a floor plan for a structure having at least one floor, each floor including a wall defining a subdivision of the structure, wherein the wall is defined by a location of at least one vertex relative to an origin, to at least one other vertex, or a combination thereof;
   generating, using the CAD tool, a representation of each wall and storing the representation of each wall;
   relating, by the CAD tool, a location of at least one vertex of the stored representation relative to the location of a vertex for a previously stored representation;
   receiving, by the CAD tool, a modification of the location of the at least one vertex of at least a portion of the stored representation;
   propagating, automatically by the CAD tool, the modification so as to modify the vertex of each other stored representation by the CAD tool as a function of the relationship between the at least one vertex of the stored representation and the vertex of each previously stored representation; and
   providing, by the CAD tool, the stored representations of each wall to serve as a model or blueprint of the structure and/or used to plan and evaluate a design of the structure and facilitate construction thereof.

2. The method of claim 1, wherein the wall defines at least a portion of an outer boundary of the floor or structure, at least a portion of an interior boundary or a combination thereof.

3. The method of claim 1, wherein propagating of the modification further comprises an affine transformation, a rubber sheeting transform, or combination thereof, to each vertex.

4. The method of claim 1, wherein the relationship is one of an absolute distance, a proportionate distance, an angle relative to a fixed direction, collinearity, or a combination thereof.

5. The method of claim 1, wherein one wall defines a subdivision of the area of a floor which at least partially overlaps a subdivision of the area of the floor defined by another wall.

6. The method of claim 1, wherein a wall defines a subdivision as an entire area of a floor.

7. The method of claim 1 wherein the specification further defines a wall defining a subdivision having at least a portion of a boundary in common with a subdivision of a previously stored representation and relating the common portion of the boundary to the associated wall.

8. The method of claim 1, wherein the specification includes a set of walls of a floor and at least one wall of the set of walls of the floor of the structure is specified as a location, within the floor, of at least one vertex relative to at least one other vertex, the location of which is specified by another wall of a set of walls of a different floor of the structure.

9. The method of claim 8, wherein the location of the at least one vertex is specified to be approximately collinear to the location of the at least one other vertex, the method further comprising snapping one of the location of the at least one vertex or the location of the at least one other vertex to the location of the at least other one vertex or the at least one vertex.

10. The method of claim 1, wherein the set of walls for a floor comprises at least one wall defining a subdivision which is not bounded by an outer boundary of the floor.

11. A system comprising:
a CAD tool configured to receive a specification defining a floorplan for a structure having at least one floor, each floor including a wall defining a subdivision of the floor, wherein the wall is defined by a location of at least one vertex relative to an origin, to at least one other vertex, or a combination thereof;
a first logic, executable by the CAD tool to cause the CAD tool to generate a representation of each wall upon receipt of the specification and store the representation of each wall;
a second logic, executable by the CAD tool to cause the CAD tool to relate a location of at least one vertex of the stored representation relative to the location of a vertex for a previously stored representation; and
a third logic, executable by the CAD tool to cause the CAD tool, upon receipt of a modification of the location of the at least one vertex of at least a portion of the stored representation, to automatically propagate the modification of the vertex of each other related wall as a function of the relationship between the at least one vertex of the at least the same portion of the stored representation and the vertex of each previously stored representation;
wherein the stored representations of each wall serves as a model or blueprint of the structure and/or is used to plan and evaluate a design of the structure and facilitate construction thereof.

12. The system of claim 11, wherein the wall defines at least a portion of an outer boundary of the floor or structure, at least a portion of an interior boundary or a combination thereof.

13. The system of claim 11, wherein the propagation of the modification further comprises an affine transformation, a rubber sheeting transform, or combination thereof, to each vertex.

14. The system of claim 11, wherein the relationship is one of an absolute distance, a proportionate distance, an angle relative to a fixed direction, collinearity, or a combination thereof.

15. The system of claim 11, wherein one wall defines a subdivision of the area of a level which at least partially overlaps a subdivision of the area of the level defined by another wall.

16. The system of claim 11, wherein a wall defines a subdivision as an entire area of a floor.

17. The system of claim 11, wherein the specification further defines a wall defining a subdivision having at least a portion of a boundary in common with a subdivision of a previously received wall and relating the common portion of the boundary to the associated wall.

18. The system of claim 11, wherein the specification includes a set of walls of a floor and at least one wall of the set of walls of the floor of the structure is specified as a location, within the floor, of at least one vertex relative to at least one other vertex, the location of which is specified by another wall of a set of walls of a different floor of the structure.

19. The system of claim 18, wherein the location of the at least one vertex is specified to be approximately collinear to the location of the at least one other vertex, the first logic is further executable by the processor to cause the processor to snap one of the location of the at least one vertex or the location of the at least one other vertex to the location of the at least one other vertex or the at least one vertex.

20. The system of claim 11, wherein the set of walls for a level comprises at least one wall defining a subdivision which is not bounded by an outer boundary of the floor.

21. A system comprising:
a CAD tool configured to receive a specification for a structure having at least one floor, the specification having a set of walls defining a subdivision of the space, wherein each wall is defined by a location of at least one vertex relative to an origin, to at least one other vertex, or a combination thereof;
the CAD tool operative to generate a representation of each wall and store the representation of each wall;
the CAD tool further operative to relate a wall defined by the received specification to each wall specified by a previously received specification for which a location of at least one vertex of the received wall is specified relative to the location of at least one vertex of the previously received wall, and whereby, upon receipt of a modification of at least a portion of at least one wall which modifies a location of at least one vertex specified thereby, the modification is propagated to each other wall, related to the wall for which the modification was received, as a function of the relationship between the vertex whose location was modified and the location of the vertex of the related wall;
wherein the stored representations of the stored walls serve as a model or blueprint of the structure and/or is used to plan and evaluate a design of the structure and facilitate construction thereof.

* * * * *